(12) United States Patent
Reich et al.

(10) Patent No.: US 6,500,878 B1
(45) Date of Patent: Dec. 31, 2002

(54) IMPROVING ADHESION OF ACRYLATE RESINS

(75) Inventors: Wolfgang Reich, Maxdorf (DE); Peter Enenkel, Hessheim (DE); Edmund Keil, Heuchelheim (DE); Matthias Lokai, Enkenbach-Alsenborn (DE); Erich Beck, Ladenburg (DE); Klaus Menzel, Ludwigshafen (DE)

(73) Assignee: BASF Aktiengesellschaft, Ludwigshafen (DE)

( * ) Notice: Subject to any disclaimer, the term of this patent is extended or adjusted under 35 U.S.C. 154(b) by 3 days.

(21) Appl. No.: 09/619,140

(22) Filed: Jul. 18, 2000

(30) Foreign Application Priority Data

Jul. 19, 1999 (DE) .......................................... 199 33 741

(51) Int. Cl.[7] .............................. C08J 3/28; C09J 5/00; C09J 4/02; C09J 163/00; C08G 59/50
(52) U.S. Cl. ..................... 522/100; 522/104; 522/134; 522/146; 522/170; 522/173; 522/174
(58) Field of Search ................................ 522/170, 146, 522/100, 104, 173, 174, 134; 528/421, 418, 332; 525/523, 530

(56) References Cited

U.S. PATENT DOCUMENTS

| 3,844,916 | A | * | 10/1974 | Gaske ........................ 522/100 |
| 3,912,608 | A | * | 10/1975 | Marans et al. |
| 4,032,482 | A | | 6/1977 | Moriya et al. |
| 4,051,195 | A | | 9/1977 | McWhorter |
| 4,336,116 | A | | 6/1982 | Schupp et al. |
| 5,516,860 | A | | 5/1996 | Reich et al. |
| 5,705,602 | A | * | 1/1998 | Kawashima et al. |
| 5,734,002 | A | * | 3/1998 | Reich et al. ................... 528/53 |
| 5,756,829 | A | | 5/1998 | Meixner et al. |
| 6,136,943 | A | * | 10/2000 | Kawashima et al. |

OTHER PUBLICATIONS

Patents Abstracts of Japan, vol. 1999, No. 08, Jun. 30, 1999, JP 11 080322, Mar. 26, 1999.

* cited by examiner

*Primary Examiner*—Susan W. Berman
(74) *Attorney, Agent, or Firm*—Oblon, Spivak, McClelland, Maier & Neustadt, P.C.

(57) ABSTRACT

In a process for improving the adhesive strength of radiation-cured films of acrylate resins which comprise compounds having at least one amine group and at least one unsaturated acrylate group and, in particular, an amino-modified acrylate resin having a molecular weight Mn of at least 300, on substrates, the acrylate resins are admixed with amine-hardenable polyepoxides having an epoxide value of from 1 to 15 mol/kg such as polyglycidyl esters or polyglycidyl ethers. Preferred curable mixtures of amine-modified acrylate resins with polyepoxides have amine numbers of from 1 to 250 mg KOH/g and epoxide values of from 0.1 to 4 mol/kg. The mixtures applied as coating films to metal substrates or plastics substrates, in particular, are radiation-cured with, e.g., UV light and an at least partial amine hardening of the polyepoxide compounds in the mixture is conducted by thermal conditioning at, e.g., from 50 to 120° C.

33 Claims, No Drawings

IMPROVING ADHESION OF ACRYLATE RESINS

The invention relates to a process for improving the adhesion of radiation-curable acrylate resins comprising amino-functional acrylates on substrates by admixing and amine-hardening a polyepoxide compound.

Radiation-curable coating materials based on acrylate resins are known and are often used for coatings on substrates such as metals or polymer moldings. The polymerization shrinkage which occurs in the course of radiation curing of the coating film applied to the substrate has an adverse effect on the adhesion of the coating material to said substrate. It is known that the adhesion of the radiation-curable coating film may be improved by increasing the molecular weight of the film-forming resins, reducing their double bond density, or adding non-reactive polymers. This, however, leads to a sharp and unwanted increase in the viscosity of the coating materials. Without doubt there exists a need for radiation-curable coating materials which are based on acrylate resins and possess good adhesion to metal or plastics substrates.

We have found that the adhesion of radiation-curable coating materials based on acrylate resins as binders to substrates is improved if the coating materials comprise at least one compound having amine groups and unsaturated acrylate groups and also comprise a small amount of polyepoxide compounds and if the coating film applied to the substrate is cured with high-energy radiation and stored, or thermally conditioned, at a temperature of above 50° C., in particular of from about 50 to 120° C.

The present invention therefore provides a process for improving the adhesive strength of radiation-curable acrylate resins or mixtures thereof, comprising a compound containing at least one amine group and at least one radiation-curable unsaturated acrylate group, to substrates, which comprises admixing the acrylate resins with at least one polyepoxide compound having an epoxide value of from 1 to 15 mol/kg, curing the film of the resultant acrylate resin, applied to the substrate, using high-energy radiation, and conducting at least partial amine hardening of the polyepoxide compounds by treatment at a temperature of above 50° C.

The acrylate resin mixture obtained by admixing the polyepoxide compound(s) is sometimes referred to below as the coating material or coating mixture.

It was surprising that the process not only led to improved adhesive strength between the substrate such as a metal sheet or polymer film and the cured coating film but also brought about a reduction in cracking in the coating films and a reduction in the yellowing of the coating materials. A further surprise was the good storage stability of the uncured mixtures in comparison to mixtures which comprise epoxy resins and low molecular mass aliphatic amines as hardeners.

Acrylate resins are understood to be known reaction products, in resin form, of (i) methacrylic acid and/or acrylic acid with (ii) at least dihydroxy polyesters, polyethers, polyurethanes or epoxy resins (which comprise at least two functional groups which react with (meth)acrylic acid), and also reaction products of (i) hydroxyalkyl (meth)acrylates with (ii) compounds containing isocyanate groups. Radiation-curable acrylate resins of this kind are customary in commerce and are described, for example, in P. K. T. Oldring, Chemistry & Technology of UV & EB Formulation for Coatings, Inks & Paints, Vol. II: Prepolymers & Reactive Diluents, J. Wiley and Sons, New York and Sita Technology Ltd., London 1997, and in H. Kittel, Lehrbuch der Lacke und Beschichtungen [Textbook of Paints and Coatings], Volume VII: Processing of Paints and Coating Materials, pp. 240–245 etc., Verlag W. A. Colomb, Berlin 1979. The acrylate resins, which are subdivided, in accordance with their preparation and the repeating structural units in the molecule chain, into polyester acrylates, polyether acrylates, urethane acrylates, epoxy acrylates and melamine acrylates, are, as what are known as radiation-curable prepolymers, of relatively low molecular mass, generally having an average molecular weight $M_n$ of from 300 to 15,000 and preferably from 400 to 3000 g/mol, as determined by gel permeation chromatography (GPC) using polystyrene as the standard and tetrahydrofuran as the eluent. The resins contain generally from 0.1 to 1.0 and preferably from 0.1 to 0.5 mol of polymerizable C—C double bonds per 100 g of prepolymer. Very suitable (meth)acrylate resins contain from 2 to 20, in particular from 2 to 10, and preferably from 2 to 6, methacryloyl and/or acryloyl groups in the molecule. Among the acrylate resins, particular suitability is possessed by those derived from polyfunctional aliphatic alcohols having no functional groups other than the hydroxyl groups, except for ether, ester, and urethane groups. Examples of alcohols are dihydric, trihydric and higher polyhydric alcohols such as propylene glycol, diethylene glycol, triethylene glycol, butanediol, hexanediol, neopentyl glycol, cyclohexanediol, glycerol, trimethylolpropane, ditrimethylolpropane, pentaerythritol, dipentaerythritol, and sorbitol. Compounds suitable for preparing polyester acrylates are primarily aliphatic polyester polyols. Polyester acrylates may be prepared in one or more stages from polyols, polycarboxylic acids, and (meth)acrylic acid. They are described, for example, in EP-A 279303. Alcohols suitable for preparing polyether acrylates are, in particular, alkoxylated, preferably ethoxylated and/or propoxylated, polyhydric alcohols, in which the degree of alkoxylation per hydroxyl group may be from 0 to 10.

In accordance with the process of the invention, the acrylate resins in the mixture comprise compounds having at least one amine group and at least one radiation-curable unsaturated acrylate group, especially amine-modified acrylate resins having a molecular weight $M_n$ of at least 300 and preferably at least 400 g/mol. The mixtures may be of amino-free acrylate resins with compounds having at least one amine group and at least one radiation-curable unsaturated acrylate group, such as an amine-modified acrylate resin, although exclusively amine-modified acrylate resins may also be used with advantage as binders. By amine-modified acrylate resins are meant here acrylate resins which comprise Michael adducts of aliphatic amines with primary and/or secondary amino groups. These may be amine-modified polyether, polyester, epoxy and urethane acrylates, with polyether and polyester acrylates being preferred. Highly suitable acrylate resins are those in which from 0.5 to 60, and in particular from 0.5 to 30, mol % of the (methlacrylic groups are present in the form of Michael adducts of an amine having a primary and/or secondary amino group. The preparation of amine-modified acrylate resins is described, for example, in Patent Applications DE-A 2346 424, DE-A 4007 146, EP-A 211 978, EP-A 280 222 and EP-A 731 121. Amine-modified acrylate resins particularly suitable for the process of the invention are those which have an amine number of from 5 to 450 and preferably from 20 to 250 mg KOH/g. The mixture of the coating components should contain an amine number of from 5 to 250, in particular from 5 to 100, and preferably from 20 to 50 mg KOH/g. Amine synergists based on multifunctional monomers may also be used in some cases.

In addition to the compound having amine groups, the coating mixtures of the invention comprise at least one amine-hardenable polyepoxide compound having an epoxide value of 1–15 and especially 3–8 mol/kg. Preference is given to aliphatic polyepoxides and also aliphatic or aromatic glycidyl ethers and glycidyl esters having at least 2 glycidyl groups. Highly suitable polyepoxides are aliphatic glycidyl ethers such as pentaerythritol triglycidyl ether, trimethylolpropane triglycidyl ether, glycerol triglycidyl ether, and neopentyl glycol diglycidyl ether. The epoxide groups of the polyepoxide compounds may also have been partially reacted with (meth)acrylic acid, subject to the proviso that two intact epoxide groups remain in the molecule. The molecular weights of suitable polyepoxide compounds are generally below 2000 and preferably below 1100 g/mol. The amount of the epoxide compounds in the mixture is guided by the epoxide value thereof and by the amount of the other constituents in the mixture; the acrylate resin mixture should have an epoxide value of from 0.1 to 4, in particular from 0.1 to 2, and preferably from 0.1 to 1, mol/kg.

For the purpose in particular of adjusting the viscosity or influencing the hardness of the coating films, the acrylate resin mixtures used in accordance with the invention may further comprise what are known as reactive diluents, i.e., radiation-curable monomers having in particular 1–4 C—C double bonds. Appropriate monomers and the criteria for their selection are described, for example, in the book cited above in connection with the radiation-curable acrylate resins, by P. K. T. Oldring, Vol. II, Chapter III, pp. 261–325. Customary additives, furthermore, may also be added to the acrylate resin mixtures, such as matting agents, fillers, pigments, leveling assistants, etc. The amount of these customary additives is generally from 0.01 to 20 and preferably from 0.05 to about 10% by weight of the total amount of the mixture.

The acrylate resin mixtures may be applied conventionally to substrates such as metals or plastics, examples being polyethylene, polypropylene, polyurethanes etc., such as by knife coating, spraying, flow coating, or rolling. Layers of the acrylate resin mixtures can be applied to a substrate.

The radiation curing of the coating films can be carried out with the aid of high-energy radiation, such as UV rays, electron beams, or gamma rays. Preference is given to curing with UV light. In this case it is necessary to admix to the mixtures at least one photoinitiator in an amount of from 0.05 to 20 and preferably from 0.05 to 5% by weight, based on the total amount of the acrylate resin mixture. In this respect, reference may be made to the extensive literature, for example, to P. K. T. Oldring, Chemistry & Technology of UV & EB Formulation for Coatings, Inks & Paints, SITA Technology, London 1991, Vol. III: Photoinitiators for Free Radical and Cationic Polymerisation. Examples of photoinitiators that may be mentioned include benzophenone, alkylbenzophenones, halogenated benzophenones, Michler's ketone, anthrone, anthraquinone and its derivatives, benzoin and its derivatives, and also acylphosphine oxides such as 2,4,6-trimethylbenzoyldiphenylphosphine oxide. The reactivity in UV polymerization may be increased in a conventional manner by adding tertiary amines such as triethylamine, triethanolamine, or amine synergists (e.g., Laromer® LR 8956). Radiation curing with UV light is suitably conducted using artificial emitters whose emission lies within the range of 2500–5000, preferably 2500–4000, angstroms. Suitable emitters are mercury vapor lamps, xenon lamps and tungsten lamps, with preference being given to the use of high-pressure mercury emitters. Radiation curing gives a scratch-resistant coating film.

For thermal curing or partial curing of the polyepoxide-amine system, the irradiated coating film is treated (thermally conditioned) at temperatures of above 50° C., in particular from 50 to 120° C., and preferably from 60 to 120° C. The temperature and duration of thermal conditioning are codetermined by the specific epoxy/amine system used and may easily be optimized in preliminary experiments. In general, thermal conditioning is carried out for from about 5 to 240 minutes, often longer. It has been found that the curing reaction initiated by the thermal conditioning often continues for a relatively long time, even if the coating has been cooled to room temperature in the meantime, thereby leading to a further improvement in the adhesive strength.

The resultant acrylate resin films have the surprising, advantageous properties indicated above. They are therefore particularly suitable for producing coatings on metal and plastic.

The examples and comparative experiments below are intended to illustrate, but not restrict, the invention.

Unless specified otherwise, all parts and percentages are by weight.

The epoxide value, or the epoxide equivalent weight, was determined in accordance with DIN 53188 by titrating a solution of resin in a dichloromethane-acetic acid mixture, with the addition of tetra-n-butylammoniumiodide and crystal violet as indicator, with 0.1 N perchloric acid up to the point of color change from blue to yellowish green. The epoxide value indicates the number of moles of epoxide groups present in 100 g of an epoxy resin. The following relation exists: epoxide value=100/epoxide equivalent weight.

The amine number indicates the number of mg of KOH that are equivalent to 1 g of the substance. It is determined by dissolving 1–2 g of the epoxy resin sample in 50 ml of acetic acid, adding crystal violet solution as indicator, and titrating with 0.1 N perchloric acid in acetic acid until the point of color change of the indicator from blue to yellowish green.

As a measure of the flexibility, the measurement was made in accordance with DIN 56156 of the Erichsen indentation (EI), in mm, both before and during thermal conditioning, with high values denoting high flexibility.

In order to test the adhesion, the cross-cut value (GT) was determined in accordance with ISO 2409 (DIN 53151), both with and without Tesa film tearoff (mT), and before and during thermal conditioning.

Additionally, in Table 3, the adhesive strength in $N/mm^2$ was measured using the Twistometer torsion measuring instrument on a coating applied at 25 $g/m^2$ to a deep-drawn metal panel. The method is described in Farbe und Lack, Vol. 80, 10/1974 and also in the BASF datasheet "Bestimmung der Haftfestigkeit" [Determination of Adhesive Strength] PM/ED 038d (Jan. 1999). By continuous rotation of a shaft, the Twistometer raises the torque on pre-prepared adhesive plugs up to the fracture load; when this load is reached, a pointer remains fixed in position and permits the adhesive strength to be read off directly in $N/mm^2$ on a scale on the instrument.

The yellowing was determined using a Lange Colorpen spectrophotometer (400–700 nm; 20 n) in analogy to DIN 6167, ISO 7724/1–3 and ASTM D 1925–70, and is reported as the b value.

The viscosity (mPa.s) was determined in accordance with DIN EN ISO 3217.

As a measure of the reactivity, the belt speed is reported at which coating film applications of 50 $g/m^2$ can be moved under an undoped high-pressure mercury lamp (output 120 W/cm lamp length; distance of lamp from substrate: 12 cm) in order to give a coating which resists scratching with the fingernail.

EXAMPLE 1

100 parts of a commercial polyether acrylate, amine-modified by Michael addition of an amine onto C—C double bonds (Laromer® LR 8889 from BASF AG) having an amine number of 45 were mixed with 5 parts of a commercial pentaerythritol glycidyl ether having an epoxide value of 6.1 mol/kg (Basoset® 162 from BASF AG) and 4 parts of a commercial photoinitiator mixture comprising equal amounts of benzophenone and 1-hydroxycyclohexyl phenyl ketone (Irgacure® 500 from Ciba-Geigy S. A.). The mixture had an amine number of 41.3 and an epoxide value of 0.3 mol/kg. The mixture was used to coat a Bonder panel (phosphated steel panel) as the substrate, in a film thickness of 67 μm, by knife coating. The coating film was cured twice with UV light at 120 W/cm and thermally conditioned at 100° C. The Erichsen indentation was 3.1 before thermal conditioning and 3.8 after 72 hours at 100° C. The adhesion (GT values) was 5.0/5 (mT) before thermal conditioning and improved to 1/2.5 (mT) after 24 hours at 100° C. and to 0/0 (mT) after 72 hours of thermal conditioning at 100° C.

EXAMPLE 2 (comparative experiment to Example 1)

The procedure of Example 1 was repeated but with no admixing of pentaerythritol glycidyl ether. The film thickness was 63 μm. Following radiation curing and before thermal conditioning, the film gave an Erichsen indentation of 4.1. After 24 hours of thermal conditioning at 100° C., the film was full of cracks, in contrast to Example 1.

EXAMPLE 3

The procedure of Example 1 was repeated but the epoxide-containing mixture was applied to the Bonder panel in a film thickness of 30 μm and after UV curing was tested and thermally conditioned as indicated above. The coating film had an Erichsen indentation (EI) of 3.5 before thermal conditioning; after thermal conditioning at 100° C. the EI value was 4.8 after 72 hours; 5.3 after 168 hours; and 6.2 after 336 hours. The adhesion (GT value) before thermal conditioning was 5/5 (mT); on thermal conditioning at 100° C. after 96 hours it was 0.5/0.5 (mT); after 168 hours it was 0/0 (mT) and after 336 hours 0/0 (mT). The coating film therefore exhibited an increasing adhesive strength for a long period with increasing thermal conditioning time.

EXAMPLE 4 (comparative experiment to Example 3)

The procedure of Example 3 was repeated but the coating mixture contained no pentaerythritol glycidyl ether. The film thickness was 30 μm. The EI values were 3.3 before thermal conditioning and then on thermal conditioning at 100° C. were 4.4 after 96 hours and 4.4 after 168 hours. Subsequently, the film was cracked. The adhesion (GT value) before thermal conditioning was 5/5 (mT) and on thermal conditioning at 100° C. was 0.5/3.5 (mT) after 96 hours and 0.5/5 (mT) after 168 hours.

EXAMPLE 5

The procedure of Example 1 was repeated but the substrate used was a Bonder panel painted white. The film thickness was 65 PD. After UV curing, the coating film was thermally conditioned at 100° C. and the yellowing b was measured. The results are shown in Table 1.

EXAMPLE 6 (comparative experiment to Example 5)

The procedure of Example 5 was repeated but the addition of an epoxide compound was omitted in the coating material. After UV curing, the coating film was thermally conditioned at 100° C. and the yellowing was measured. The results are shown in Table 1.

TABLE 1

Yellowing values b on thermal conditioning of the coating materials from Examples 5 and 6 (comparative)

| | Substrate | Thermal conditioning time (hours) | | | | | |
| --- | --- | --- | --- | --- | --- | --- | --- |
| | | 0 | 24 | 48 | 72 | 144 | 240 | 384 |
| Yellowing b Example 5 (with epoxide) | 0.0 | 2 | 4.9 | 5.2 | 5.5 | 6.6 | 7.6 | 9.3 |
| Yellowing b Example 6 (without epoxide) | 0.2 | 2 | 6.3 | 7.6 | 8.1 | 9.4 | 9.7 | 10.3 |

EXAMPLE 7

The procedure of Example 5 was repeated but the film thickness was 29 μm. After UV curing, the coating film was thermally conditioned at 100° C. and the yellowing b was measured. The results are shown in Table 2.

EXAMPLE 8 (comparative experiment to Example 7)

The procedure of Example 7 was repeated but the addition of an epoxide compound to the coating material was omitted. The film thickness was 31 μm. After UV curing, the coating film was thermally conditioned at 100° C. and the yellowing b was measured.

The results are shown in Table 2.

TABLE 2

Yellowing values b on thermal conditioning of the coating materials from Examples 7 and 8 (comparative)

| | Substrate | Thermal conditioning time (hours) | | | | |
| --- | --- | --- | --- | --- | --- | --- |
| | | 0 | 24 | 96 | 168 | 336 |
| Yellowing b Example 7 (with epoxide) | 0.1 | 1.9 | 4.2 | 5.3 | 5.6 | 6.9 |
| Yellowing b Example 8 (without epoxide) | 0.0 | 1.9 | 5.1 | 6.5 | 6.6 | 6.9 |

EXAMPLES 9–15

7 batches were prepared of a mixture of 50 parts of a commercial polyester acrylate amine-modified by Michael addition of an amine onto C—C double bonds (Laromer® LR 8907 from BASF AG) having an amine number of 24, 50 parts of a commercial polyether acrylate amine-modified in the same way (Laromer® LR 8889 from BASF AG) having an amine number of 45, and 4 parts of the photoinitiator mixture Irgacure® 500 specified in Example 1.

One batch was processed without the addition of an epoxide compound (Example 9), three batches were admixed with Epikote® 828 (unmodified bisphenol A-epichlorohydrin epoxy resin) having an epoxide value of 6.3 mol/kg in amounts of 2.5 parts (Example 10), 5 parts (Example 11) and 10 parts (Example 12), and three batches were admixed with Basoset® 162 (pentaerythritol glycidyl ether) having an epoxide value of 6.1 mol/kg in amounts of 2.5 parts (Example 13), 5 parts (Example 14) and 10 parts (Example 15).

The reactivities of the resultant mixtures were measured. Also measured were the viscosities of the mixtures directly following their preparation and after 16 hours of thermal conditioning at 80° C. Also measured, furthermore, using the Twistometer were the adhesive strengths of the coating films of the batches (applied in an amount of 25 g/m$^2$) on degreased deep-drawn metal panels after UV curing (120 W/cm, belt speed 10 m/min) and subsequent one-hour thermal conditioning at 125° C. Also measured, furthermore, were the adhesions (cross-cut values) of the coating films of the batches (applied in an amount of 50 g/m$^2$) on a laminated panel provided with a melamine resin coating (Rhenodur panel) after UV curing and 3-hour thermal conditioning at 80° C. and also after subsequent storage at room temperature (RT). Also measured, moreover, was the yellowing, in the form of b values.

An overview of the experiments and experimental results are shown in Table 3. Accordingly, a significant reaction takes place in the case of Example 15, and without thermal conditioning the results of Examples 10 to 15 do not differ greatly from those of Example 9.

TABLE 3

Results of Examples 9 to 15

| | Example | | | | | | |
|---|---|---|---|---|---|---|---|
| | 9 | 10 | 11 | 12 | 13 | 14 | 15 |
| LR 8907 (parts) | 50 | 50 | 50 | 50 | 50 | 50 | 50 |
| LR 8889 (parts) | 50 | 50 | 50 | 50 | 50 | 50 | 50 |
| Initiator (parts) | 4 | 4 | 4 | 4 | 4 | 4 | 4 |
| Epikote 828 (parts) | 0 | 2.5 | 5 | 10 | 0 | 0 | 0 |
| Basoset 162 (parts) | 0 | 0 | 0 | 0 | 2.5 | 5 | 10 |
| Amine number of the mixture | — | 32.4 | 31.6 | 30.2 | 32.4 | 31.6 | 30.2 |
| Epoxide value of the mixture (mol/kg) | — | 0.12 | 0.24 | 0.46 | 0.14 | 0.28 | 0.54 |
| Reactivity m/min; 50 g/m$^2$ | 25 | 25 | 25 | 25 | 25 | 25 | 25 |
| Viscosity immediate | 1 | 1.1 | 1.2 | 1.3 | 1.1 | 1.1 | 1.2 |
| Viscosity 16 h, 80° C. | 1.9 | 1.1 | 1 | 2 | 1.4 | 1.2 | 3.2 |
| 25 g/m$^2$ adhesive strength Twistometer DD panel 10 m/min UV thermal conditioning: 1 h, 125° C. | 19.3 | 19.8 | 20 | 24 | 19.5 | 21 | 28.5 |
| 50 g/m$^2$ adhesion GT Rhenodur panel 10 m/min UV | GT 4 | GT 4 | GT 4 | GT 4 | GT 4 | GT 4 | GT 3 |

TABLE 3-continued

Results of Examples 9 to 15

| | Example | | | | | | |
|---|---|---|---|---|---|---|---|
| | 9 | 10 | 11 | 12 | 13 | 14 | 15 |
| thermal conditioning: 3 h, 80° C. 50 g/m$^2$ adhesion GT Rhenodur panel 10 m/min UV thermal conditioning: 3 h, 80° C. +24 h, RT | GT 4 | GT 4 | GT 4 | GT 4 | GT 3.5 | GT 2 | GT 0.5 |
| Yellowing b after thermal conditioning 3 h, 80° C. +24 h, RT | 7.5 | 6.6 | 6.5 | 6 | 6.4 | 6.1 | 5.7 |

EXAMPLES 16–20

Comparative experiments were conducted on the storage stability of mixtures of a non-amine-modified polyester acrylate (Laromer® LR 8912) with photoinitiator Irgacure® 500, the epoxide compounds Basoset® 162 (see Example 1) and Epikote® 828 (see Example 9), using on the one hand methyldiethanolamine (MDEA) as the amine (Examples 16, 18, and 19) and on the other hand amine-modified acrylate resins as amines (Example 20). The viscosity was measured in each case immediately after the preparation of the mixtures and also after 24 hours of thermal conditioning at 60° C. (Examples 16–19) or 16 hours of thermal conditioning at 80° C. (Example 20). The results are shown in Tab. 4, in accordance with which a combination of amine-modified acrylate resins with an epoxide showed good storage stability (Example 20), which was not the case with the combinations of (amino-free) acrylate resins with an epoxide compound and methyldiethanolamine.

TABLE 4

Comparative experiments on storage stability

| | Example | | | | |
|---|---|---|---|---|---|
| | 16 | 17 | 18 | 19 | 20 |
| Acrylate resin LR 8912 (parts) (amino-free) | 100 | 100 | 100 | 100 | 0 |
| Acrylate resin LR 8907 (parts) (with amino groups) | 0 | 0 | 0 | 0 | 50 |
| Acrylate resin LR 8889 (parts) (with amino groups) | 0 | 0 | 0 | 0 | 50 |
| Initiator (parts) | 4 | 4 | 4 | 4 | 4 |
| Epikote 828 (parts) | 0 | 0 | 0 | 10 | 10 |
| Basoset 162 (parts) | 0 | 10 | 10 | 0 | 0 |
| Methyldiethanolamine (parts) | 3 | 0 | 3 | 3 | 0 |
| Viscosity mPa.s immediate | 3.8 | 3.1 | 3.4 | 4.2 | 1.3 |

TABLE 4-continued

Comparative experiments on storage stability

| | Example | | | | |
|---|---|---|---|---|---|
| | 16 | 17 | 18 | 19 | 20 |
| Viscosity mPa.s after 24 h, 60° C. (16 h, 80° C.) | 3.6 | 3.2 | 15.2 | 22 | 2 |

We claim:

1. A process for improving the adhesion of radiation-curable acrylate resins to substrates, which comprises:
   admixing an acrylate resin mixture comprising an acrylate resin component containing at least one amine group and at least one radiation-curable unsaturated acrylate group and at least one amine-free acrylic resin with at least one curable polyepoxide compound having an epoxide value ranging from 1–15 mol/kg;
   applying the resultant mixture to a substrate; and
   curing the applied mixture by exposure to high energy radiation and by treatment at a temperature of above about 50° C.

2. The process as claimed in claim 1, wherein the polyepoxide compound comprises at least 2 glycidyl ether or glycidyl ester groups.

3. The process as claimed in claim 1, wherein the acrylate resin component containing at least one amine group and at least one radiation-curable unsaturated acrylate group has an amine number ranging from 5 to 450 mg KOH/g.

4. The process as claimed in claim 1, wherein the acrylate resin mixture has an amine number ranging from 5 to 250 mg KOH/g.

5. The process as claimed in claim 4, wherein said amine number ranges from 5 to 100 mg KOH/g.

6. The process as claimed in claim 1, wherein the epoxide value of the mixture ranges from 0.1 to 4 mol/kg.

7. The process as claimed in claim 6, wherein said epoxide value ranges from 0.1 to 2 mol/kg.

8. The process as claimed in claim 7, wherein said epoxide value ranges from 0.1 to 1 mol/kg.

9. The process as claimed in claim 1, wherein the acrylate resin mixture further comprises reactive diluents.

10. The process as claimed in claim 1, which comprises applying said admixture of radiation-curable acrylate resin and polyepoxide as a film to the substrate, and then curing the acrylate resin mixture by irradiation and subsequently treating the applied film at a temperature of above about 50° C.

11. The process as claimed in claim 1, wherein the polyepoxide compound at least partially reacts with the amine groups of the amine-modified acrylate resin by treatment at a temperature ranging from about 50 to 120° C., thereby at least partially curing the polyepoxide compound.

12. The process as claimed in claim 1, wherein said admixture is applied to the substrate in plural layers, followed by irradiation which cures the layers and heat treatment at a temperature ranging from about 50 to 120° C. for about 5 to 240 minutes.

13. The process as claimed in claim 1, wherein the acrylate resin mixture comprises from 1 to 20% by weight, based on the total amount of the acrylate resin mixture, of at least one photoinitiator, and wherein the admixture is applied to the substrate in plural layers followed by exposure of the applied layers to high energy, ultraviolet radiation to cure the layers.

14. The process as claimed in claim 1, wherein the substrate is a metal or plastic substrate.

15. The process as claimed in claim 1, wherein the acrylate resin containing at least one amine group is formed from an acrylate resin which is the reaction product of (meth)acrylic acid with a dihydroxy polyester, dihydroxy polyether, dihydroxy polyurethane or epoxy resin or is a reaction product of a hydroxyalkyl(meth)acrylate with a compound containing isocyanate groups.

16. The process as claimed in claim 1, wherein the acrylate resin containing at least one amine group is formed from an acrylate resin which is a polyester acrylate, a polyether acrylate, a urethane acrylate, an epoxy acrylate or a melamine acrylate having a number average molecular weight ranging from 300 to 15,000 g/mol.

17. The process as claimed in claim 16, wherein the number average molecular weight of said resin ranges from 400 to 3,000 g/mol.

18. A process for improving the adhesion of radiation-curable acrylate resins to substrates, which comprises:
   admixing an acrylate resin component containing at least one amine group and at least one radiation-curable unsaturated acrylate group with at least one curable polyepoxide compound having an epoxide value ranging from 1–15 mol/kg;
   applying the resultant mixture to a substrate; and
   curing the applied mixture by exposure to high energy radiation and by treatment at a temperature of above about 50° C.

19. The process as claimed in claim 18, wherein the polyepoxide compound comprises at least 2 glycidyl ether or glycidyl ester groups.

20. The process as claimed in claim 18, wherein the acrylate resin mixture has an amine number ranging from 5 to 250 mg KOH/g.

21. The process as claimed in claim 20, wherein said amine number ranges from 5 to 100 mg KOH/g.

22. The process as claimed in claim 18, wherein the epoxide value of the mixture ranges from 0.1 to 4 mol/kg.

23. The process as claimed in claim 21, wherein said epoxide value ranges from 0.1 to 2 mol/kg.

24. The process as claimed in claim 23, wherein said epoxide value ranges from 0.1 to 1 mol/kg.

25. The process as claimed in claim 18, wherein the admixture further comprises reactive diluents.

26. The process as claimed in claim 18, which comprises applying said acrylic resin component and polyepoxide as a film to the substrate, and then curing the acrylate resin mixture by irradiation and subsequently treating the applied film at a temperature of above about 50° C.

27. The process as claimed in claim 18, wherein the polyepoxide compound at least partially reacts with the amine groups of the amine-modified acrylate resin by treatment at a temperature ranging from about 50 to 120° C., thereby at least partially curing the polyepoxide compound.

28. The process as claimed in claim 18, wherein said admixture is applied to the substrate in plural layers, followed by irradiation which cures the layers and heat treatment at a temperature ranging from about 50 to 120° C. for about 5 to 240 minutes.

29. The process as claimed in claim 18, wherein the admixture comprises from 1 to 20% by weight, based on the total amount of the acrylate resin, of at least one photoinitiator, and wherein the admixture is applied to the substrate in plural layers followed by exposure of the applied layers to high energy, ultraviolet radiation to cure the layers.

30. The process as claimed in claim 18, wherein the substrate is a metal or plastic substrate.

31. The process as claimed in claim 18, wherein the acrylate resin containing at least one amine group is formed from an acrylate resin which is the reaction product of (meth)acrylic acid with a dihydroxy polyester, dihydroxy polyether, dihydroxy polyurethane or epoxy resin or is a reaction product of a hydroxyalkyl(meth)acrylate with a compound containing isocyanate groups.

32. The process as claimed in claim 18, wherein the acrylate resin containing at least one amine group is formed from an acrylate resin which is a polyester acrylate, a polyether acrylate, a urethane acrylate, an epoxy acrylate or a melamine acrylate having a number average molecular weight ranging from 300 to 15,000 g/mol.

33. The process as claimed in claim 32, wherein the number average molecular weight of said resin ranges from 400 to 3,000 g/mol.

* * * * *

UNITED STATES PATENT AND TRADEMARK OFFICE
CERTIFICATE OF CORRECTION

PATENT NO. : 6,500,878 B1
DATED : December 31, 2002
INVENTOR(S) : Wolfgang Reich et al.

It is certified that error appears in the above-identified patent and that said Letters Patent is hereby corrected as shown below:

Column 10,
Line 43, "Claim 21" should read -- Claim 22 --.

Signed and Sealed this

Twenty-eighth Day of October, 2003

JAMES E. ROGAN
*Director of the United States Patent and Trademark Office*